United States Patent
Bai

(10) Patent No.: US 7,494,934 B2
(45) Date of Patent: Feb. 24, 2009

(54) METHOD OF ETCHING CARBON-CONTAINING LAYER AND METHOD OF FABRICATING SEMICONDUCTOR DEVICE

(75) Inventor: Keun-hee Bai, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 11/512,026

(22) Filed: Aug. 29, 2006

(65) Prior Publication Data
US 2007/0082483 A1    Apr. 12, 2007

(30) Foreign Application Priority Data
Oct. 12, 2005    (KR)    ....................... 10-2005-0096164

(51) Int. Cl.
*H01L 21/302* (2006.01)
*H01L 21/461* (2006.01)

(52) U.S. Cl. ...................... 438/710; 438/712

(58) Field of Classification Search ................ 438/725, 438/150, 702, 291, 712, 710
See application file for complete search history.

(56) References Cited

U.S. PATENT DOCUMENTS

| | | | |
|---|---|---|---|
| 6,547,977 B1 | 4/2003 | Yan et al. | |
| 6,703,265 B2 * | 3/2004 | Asami et al. | 438/150 |
| 6,835,663 B2 | 12/2004 | Lipinski | 438/695 |
| 7,115,524 B2 * | 10/2006 | Honeycutt et al. | 438/725 |
| 2004/0079726 A1 | 4/2004 | Tabery et al. | 216/58 |

FOREIGN PATENT DOCUMENTS

| | | |
|---|---|---|
| JP | 06-349782 | 12/1994 |
| JP | 2004-031892 | 1/2004 |
| KR | 2001-0042419 | 5/2001 |
| KR | 10-2004-0003652 A | 1/2004 |
| WO | WO 99/52135 | 10/1999 |

* cited by examiner

*Primary Examiner*—Davienne Monbleau
*Assistant Examiner*—Monica D Harrison
(74) *Attorney, Agent, or Firm*—Mills & ONello, LLP

(57) ABSTRACT

A method of etching a carbon-containing layer on a semiconductor substrate using a Si-containing gas and a related method of fabricating a semiconductor device in which a plurality of contact holes having excellent sidewall profiles are formed by etching an interlayer insulating layer using a carbon-containing layer pattern formed in accordance with the invention and having a width of several tens of nm as an etch mask are provided. To etch a carbon-containing layer to be used as a second etch mask, a first mask pattern is formed on the carbon-containing layer to partially expose a top surface of the carbon-containing layer. The carbon-containing layer is then anisotropically etched with a plasma of a carbon-etching mixture gas formed of $O_2$ and a Si-containing gas using the first mask pattern as a first etch mask to form the carbon-containing layer pattern. Neighboring contact holes in a high-density cell array region fabricated in accordance with this invention are distinctly separated from each other, even when an interval between the neighboring contact holes is as small as several tens of nm or less; and, thus, a short-circuit between neighboring unit cells using such contact holes can be prevented.

23 Claims, 7 Drawing Sheets

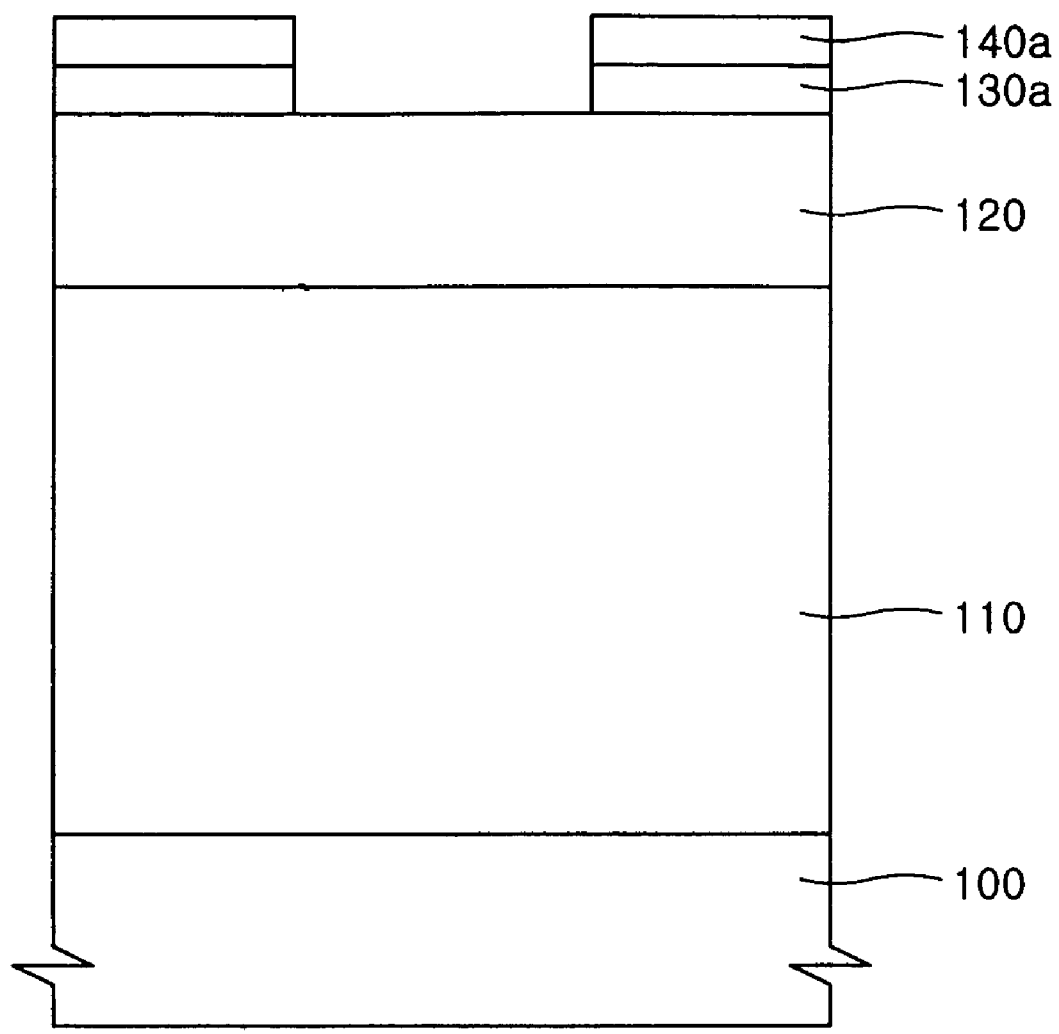

METHOD OF ETCHING CARBON-CONTAINING LAYER AND METHOD OF FABRICATING SEMICONDUCTOR DEVICE

CROSS-REFERENCE TO RELATED PATENT APPLICATION

This application claims the benefit of Korean Patent Application No. 10-2005-0096164, filed on Oct. 12, 2005, in the Korean Intellectual Property Office, the disclosure of which is incorporated herein in its entirety by reference.

BACKGROUND OF THE INVENTION

1. Field of the Invention

The present invention relates to an etching method for use in connection with semiconductor device fabrication and to a method of fabricating a semiconductor device using the same, and more particularly, to a method of etching a carbon-containing layer using a new etching gas and to a method of fabricating a semiconductor device using the same.

2. Description of the Related Art

As semiconductor devices have become more integrated and the feature size thereof has correspondingly decreased, the horizontal areas of the semiconductor devices have also decreased while the thicknesses of such semiconductor devices have increased. As a result, the heights of unit elements and contacts for electrically connecting the unit elements have increased, and thus, the aspect ratios of the corresponding contact holes have also increased. In the etching process for forming a pattern having such an increased aspect ratio, the thickness of a layer to be etched is greater and there is essentially no etching process margin due to the height of the photoresist pattern that needs to be used. Therefore, the thickness of the photoresist layer is decreased, and a relatively thin photoresist layer leads to a number of problems. To solve the problems associated with the photoresist pattern being thin, a technique of using an amorphous carbon layer (ACL) as an etch mask has been developed (See U.S. Patent Laid-open Publication No. 2004/0079726 A1), the disclosure of which is incorporated herein by reference.

An etch mask including an ACL for forming a fine pattern of a highly-integrated semiconductor device (on the scale of microns or smaller) may be an etch mask including a multi-layer structure in which an ACL, a capping layer, and a photoresist layer are sequentially stacked on a film to be etched on a substrate. In this case, a photoresist pattern is formed through exposure and development processes, and that pattern is transferred to an anti-reflection layer and the capping layer, thus producing a capping layer pattern. The ACL is etched using the capping layer pattern as a first etch mask, and the capping layer pattern is thereby transferred to the ACL, thus producing an ACL pattern. The thus formed ACL pattern is then used as a second etch mask for etching the film to be etched on the substrate. After the film to be etched is etched, residues and etching byproducts of the ACL pattern are removed through ashing and stripping processes.

The ACL of the etch mask having the multilayer structure as described above includes carbon as a primary component. Accordingly, an etching gas commonly including $O_2$, $N_2$, or a combination thereof may be used to etch the ACL. The capping layer interposed between the ACL and the photoresist layer is preferably formed of a material, for example, SiON or $SiO_2$, which has strong etch resistance to components (such as $O_2$ and $N_2$) which are used as the ACL etching gas, and which also enables low-temperature deposition.

However, as semiconductor devices have become more highly integrated and the width of unit elements has correspondingly decreased, the thickness of the photoresist layer has become reduced, and, accordingly, the thickness of the capping layer has also become reduced. When etching an ACL using a relatively thin capping layer as a first etch mask, the etch selectivity between the capping layer and the ACL layer becomes a critical factor in obtaining an excellent sidewall profile of an ACL pattern to be used as the second etch mask in the succession of etching steps. Particularly, when an ACL is etched using plasma, the capping layer is sputtered by ions, thereby additionally degrading the etch resistance of the capping layer.

In the prior art, to increase the etch resistance of a relatively thin capping layer used as an etch mask for etching an ACL, a fluorocarbon series gas may be injected so that a protective carbon series polymer is stacked on the capping layer. However, since an ACL includes carbon as a primary component, an etching gas that includes $N_2$ or $O_2$ must be used to etch the carbon. Thus, when etching the ACL using an etching gas that also includes the fluorocarbon series gas, it is difficult to deposit the protective carbon series polymer on the capping layer, and, accordingly, a desired etch selectivity of the ACL relative to the capping layer is difficult to obtain.

To form a fine pattern, e.g., a contact hole pattern, that is beyond the ordinary resolution limit of a photolithographic process, the shape of a hole (as defined by an etch mask) that is needed to form the contact hole or other fine pattern is commonly required to have a smaller critical dimension (CD) in the bottom or lower portion thereof than in the top or upper portion, which is an inlet of the contact hole. Accordingly, the ACL pattern obtained by etching the ACL should preferably be formed with an inclined or cone-shaped sidewall profile to reduce the CD of the bottom of the hole relative to the inlet opening at the upper portion of the hole. To obtain such an inclined sidewall profile, a polymer acting as an etch mask could be deposited on sidewalls of the hole being formed by etching the ACL. However, it is difficult to etch the pattern with the inclined sidewall profile following such polymer deposition.

These and other problems with or limitations of the prior art techniques are overcome in whole, or at least in part, by the methods of this invention.

SUMMARY OF THE INVENTION

The present invention provides solutions to the aforementioned problems associated with the prior art approaches. The present invention provides a method of etching a carbon-containing layer, particularly an ACL, to form a contact hole with an inclined sidewall profile such that the CD at a bottom of the hole is less than the CD at a top portion of the hole, which serves as an inlet of the hole. Such a structure is obtained by etching a carbon-containing layer with sufficient etch selectivity of the carbon-containing layer, such as ACL, relative to a capping layer used as an etch mask in an etching process to obtain the desired fine pattern formation.

The present invention also provides a method of fabricating a semiconductor device in which a contact hole is formed using an etch mask for etching the carbon-containing layer having sufficient etch resistance to achieve the desired results. In the method, when forming a contact hole having a high aspect ratio as needed to form a contact for a highly integrated semiconductor device, neighboring contact holes maintain a small but distinct distance from each other upon etching even when an interval between neighboring contact holes is as narrow as several tens of nm or less, thereby preventing short-circuits between neighboring contacts.

According to an aspect of the present invention, there is provided a method of etching a carbon-containing layer, such method comprising the steps of: forming a mask pattern on the carbon-containing layer to partially expose a top surface of the carbon-containing layer; and anisotropically etching the carbon-containing layer with plasma comprising a carbon-etching mixture gas formed of $O_2$ and a Si-containing gas using the mask pattern as a first etch mask, to form in turn a carbon-containing layer pattern to be used as a second etch mask.

According to another aspect of the present invention, there is provided a method of fabricating a semiconductor device, such method comprising the steps of: forming an interlayer insulating layer on a semiconductor substrate; forming a carbon-containing layer on the interlayer insulating layer; forming a capping layer on the carbon-containing layer; patterning the capping layer using a photolithography process to form a capping layer pattern which partially exposes a top surface of the carbon-containing layer; anisotropically etching the carbon-containing layer with plasma comprising a carbon-etching mixture gas formed of $O_2$ and a Si-containing gas using the capping layer pattern as a first etching mask to form a carbon-containing layer pattern; and anisotropically etching the interlayer insulating layer using the carbon-containing layer pattern as a second etching mask to form a contact hole through the interlayer insulating layer.

The Si-containing gas may be selected from the group consisting of $SiF_4$, $SiCl_4$, $SiH_4$, $SiCl_xF_y$ (wherein x+y=4) or combinations thereof.

When the carbon-etching mixture gas consists essentially of only $O_2$ and a Si-containing gas, the carbon-etching mixture gas may be formed of about 50 to 95% by volume of $O_2$ and correspondingly about 50 to 5% by volume of the Si-containing gas based on the total volume of the carbon-etching mixture gas at a given temperature/pressure.

However, in alternative invention embodiments, the carbon-etching mixture gas may further include at least one material selected from $N_2$ and an inert gas. For example, the carbon-etching mixture gas may be formed of 20 to 95% by volume of $O_2$ based on the total volume of the carbon-etching mixture gas, about 50 to 5% by volume of the Si-containing gas based on the total volume of the carbon-etching mixture gas, about 0 to 100% by volume of $N_2$ relative to the volume of $O_2$ in the carbon-etching mixture gas, and about 0 to 50% by volume of the inert gas relative to the volume of $O_2$ in the carbon-etching mixture gas. In this invention embodiment, the content of $N_2$ and the content of the inert gas in the carbon-etching mixture gas are not simultaneously zero (i.e., at least some $N_2$ or some inert gas would be included in the carbon-etching mixture gas).

According to a particular embodiment of the present invention, plasma of a carbon-etching mixture gas including $O_2$ and a Si-containing gas is used to anisotropically etch a carbon-containing layer which is, in turn, intended to be used as a second etch mask, such that a Si series polymer residue layer (which is an etching residue) is formed on the capping layer pattern that is being used as the first etching mask during the step of etching the carbon-containing layer. Accordingly, the capping layer pattern is protected by the Si polymer residue such that a sufficient etch selectivity of the capping layer pattern relative to the carbon-containing layer is obtained. In addition, it is possible to perform etching so that a hole obtained by etching the carbon-containing layer has a smaller CD at a bottom portion thereof than at a top portion thereof, which is an inlet of the hole. Accordingly, the present invention is particularly advantageous when applied to the formation of a contact hole having a high aspect ratio as needed to form a contact for a highly integrated semiconductor device.

BRIEF DESCRIPTION OF THE DRAWINGS

The above and other features and advantages of the present invention will become more apparent by describing in detail exemplary embodiments thereof with reference to the attached drawings in which:

FIGS. 2A through 2D are schematic cross-sectional views illustrating a method of fabricating a semiconductor device according to an embodiment of the present invention;

DETAILED DESCRIPTION OF THE INVENTION

Figure 1:
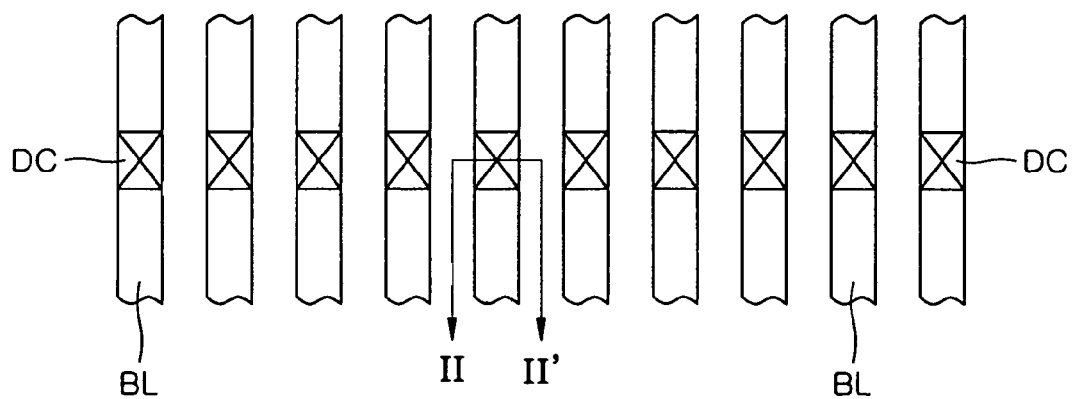
FIG. 1 schematically illustrates the layout of a primary portion of an exemplary semiconductor device wherein a method of fabricating a semiconductor device according to an embodiment of the present invention is advantageously applicable.

FIG. 1 schematically illustrates the layout of a primary portion of an exemplary semiconductor device wherein a method of fabricating a semiconductor device according to an embodiment of the present invention is advantageously applicable.

More particularly, the layout of a portion of a cell block constituting a NAND type flash memory device is illustrated in FIG. 1. Particularly, the layout of direct contacts DC connected to bit lines BL is illustrated. In a recent design rule, the direct contacts DC are arranged at intervals of several tens of nm, for example, about 20 to 40 nm. The present invention provides effective and efficient methods of forming patterns that are arranged at such relatively narrow intervals as described above using an amorphous carbon layer (ACL) pattern as an etch mask.

FIGS. 2A through 2D are schematic cross-sectional views illustrating a method of fabricating a semiconductor device according to an embodiment of the present invention. FIGS. 2A through 2D show schematic cross-sectional views of a portion corresponding to a section taken along a line such as II-II' of FIG. 1 to illustrate a process in accordance with this invention of forming the direct contact DC shown in FIG. 1 on a semiconductor substrate.

Figure 2A:
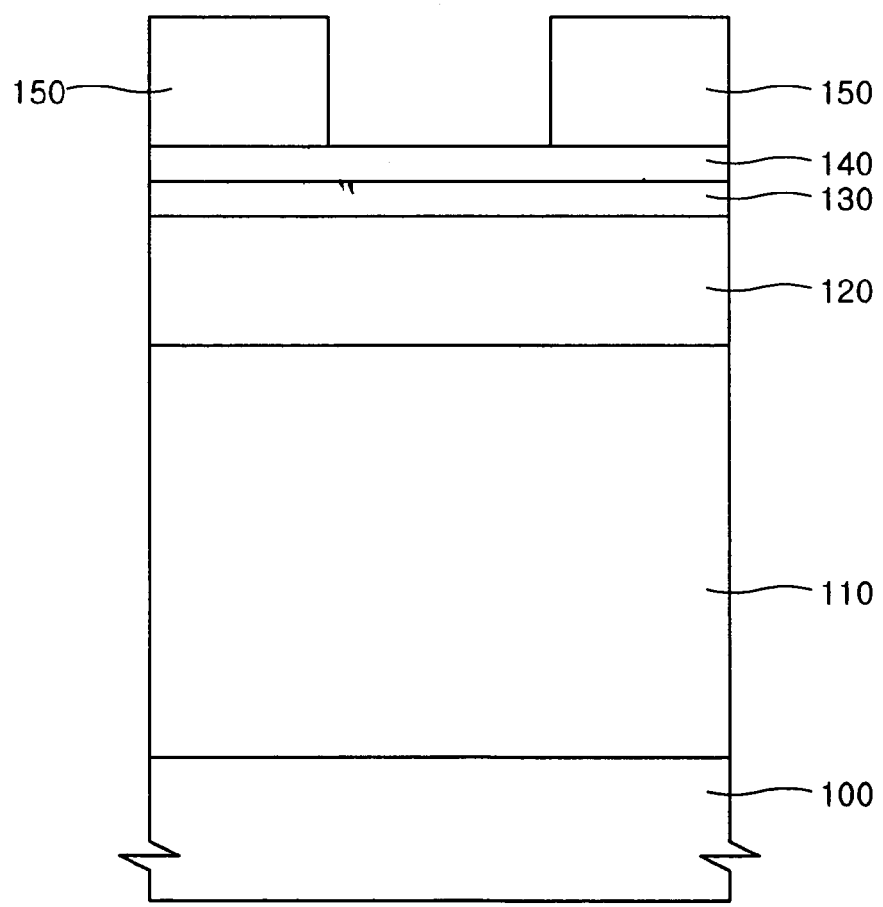

Referring to FIG. 2A, an interlayer insulating layer 110 as a film to be etched is formed on a suitable semiconductor substrate 100. The interlayer insulating layer 110 may comprise, for example, an oxide layer, a nitride film, or a combination thereof. The interlayer insulating layer 110 may be formed to a thickness of, for example, about 5,000 to 15,000 Å.

A carbon-containing layer 120, for example an ACL or similar material, is formed on the interlayer insulating layer 110. The carbon containing layer 120 may, in some embodiments, be composed of carbon and hydrogen, or, in other embodiments, consist essentially of carbon, hydrogen and oxygen. For example, the carbon-containing layer 120 may be formed of a material identified in the trade as APF (product model, manufactured by AMAT Corp., referred to as "ACL"), a material identified in the trade as SiLK (product model, manufactured by Dow Chemical Co.), a material identified in the trade as NCP (product model, manufactured by ASM Corp.), a material identified in the trade as AHM (product model, manufactured by Novellous Corp.), or similar such materials. The thickness of the carbon-containing layer 120 may be appropriately selected by considering the thickness of the interlayer insulating layer 110. For example, the carbon-containing layer 120 may be formed to a thickness of 1,000 to 2,000 Å.

A capping layer 130 is formed on the carbon-containing layer 120. The capping layer 130 is to be used as a first etch mask for etching the carbon-containing layer 120. The capping layer 130 is preferably a layer that facilitates low-temperature deposition, for example, deposition at a temperature of about 400° C. or less. For example, the capping layer 130 may be formed of SiON, plasma-enhanced (PE) oxide, tetraethyl orthosilicate (TEOS), atomic layer deposition (ALD) oxide, Si, SiGe, or combinations thereof. The thickness of the capping layer 130 is appropriately selected by reference to the thickness of a photoresist layer to be formed on the capping layer 130. For example, the capping layer 130 may be formed to a thickness of about 300 to 500 Å.

An organic anti-reflection layer 140 and a photoresist pattern 150 are sequentially formed on the capping layer 130. The organic anti-reflection layer 140 may be formed to a thickness of about 300 to 500 Å. For some invention embodiments, the organic anti-reflection layer 140 may be unnecessary and, in these cases, it need not be formed.

The photoresist pattern 150 may for some invention embodiments be formed of a photoresist material suitable for a KrF, ArF, or $F_2$ light source, but photoresist pattern 150 in this invention is not limited to such materials.

Referring to FIG. 2B, the organic anti-reflection layer 140 (as seen in FIG. 2A, if present) and the capping layer 130 (as seen in FIG. 2A) are sequentially anisotropically dry etched using the photoresist pattern 150 as a preliminary etch mask, thus producing an organic anti-reflection layer pattern 140a (if present) and a capping layer pattern 130a, as seen in FIG. 2B. In this preliminary etching process, part of or all of the photoresist pattern 150 may be removed.

Figure 2C:
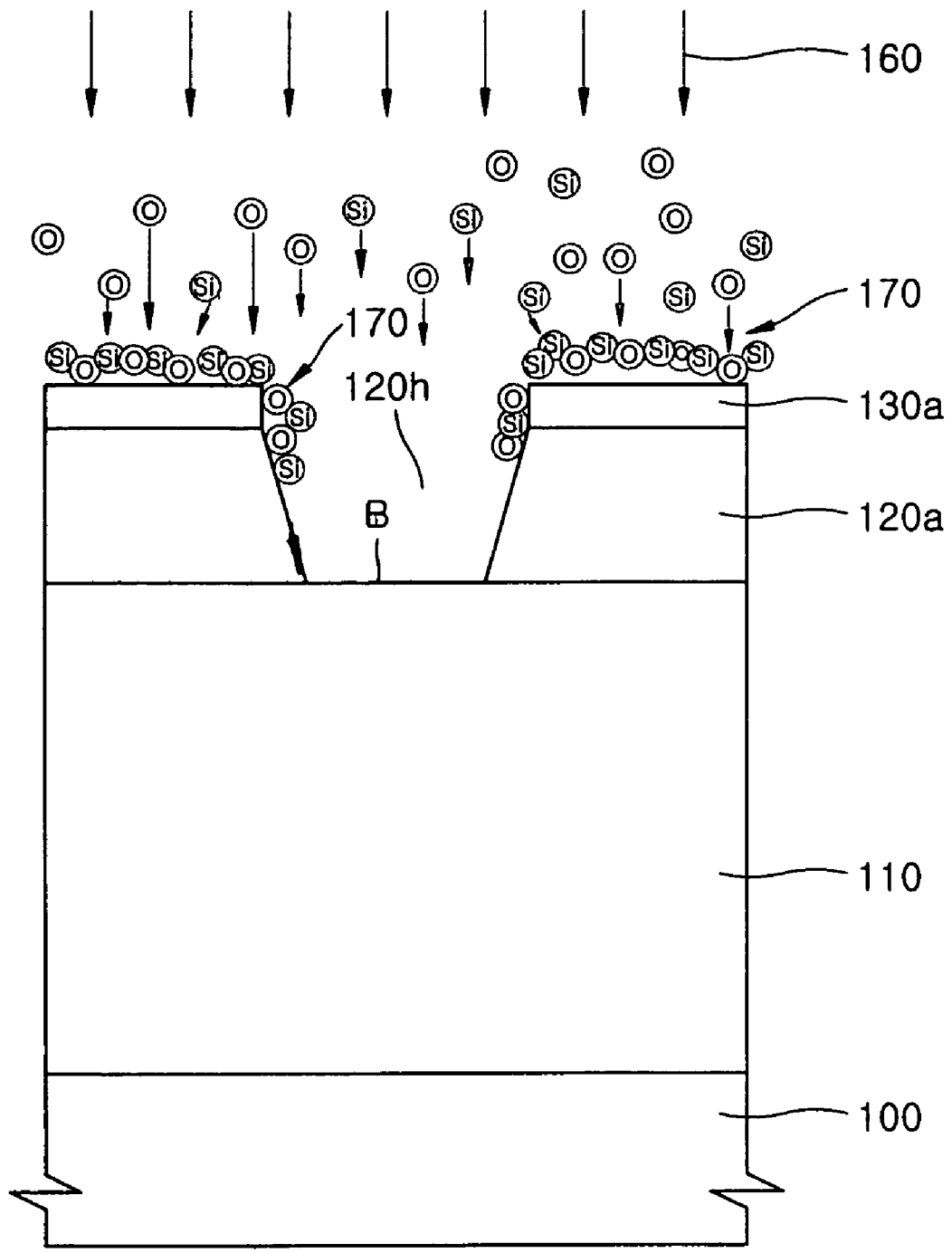

Referring to FIG. 2C, the carbon-containing layer 120 is anisotropically etched using a plasma etching process in accordance with this invention using the capping layer pattern 130a as a first etch mask to form a carbon-containing layer pattern 120a having or defining a hole 120h. In this process, the organic anti-reflection layer pattern 140a (if present) may be removed. Alternatively, the organic anti-reflection layer pattern 140a may be removed though a separate process step carried out before or after the etching process for forming the carbon-containing layer pattern 120a.

To form the carbon-containing layer pattern 120a in accordance with this invention, the plasma etching process may be performed by plasma etching equipment utilizing an inductively coupled plasma (ICP) technique or using a dual frequency capacitively coupled plasma (CCP) technique, or any other suitable plasma technique. At this time, a carbon-etching mixture gas (represented by the arrows 160) formed of $O_2$ and an effective amount of a Si-containing gas is used as the plasma etching gas.

In an exemplary embodiment of the present invention, the Si-containing gas may be $SiF_4$, $SiCl_4$, $SiH_4$, $SiCl_xF_y$ (wherein x+y=4), or combinations thereof. When the carbon-etching mixture gas 160 consists essentially of only $O_2$ and the Si-containing gas, the carbon-etching mixture gas 160 may include for example about 50 to 95% by volume of $O_2$ and correspondingly about 50 to 5% by volume of the Si-containing gas respectively based on the total volume of the carbon-etching mixture gas 160 at a given reaction temperature pressure.

By using the Si-containing gas with $O_2$ when etching the carbon-containing layer 120 using the capping layer pattern 130a as a first etch mask as described above, it is possible to increase the etch selectivity of the capping layer pattern 130a relative to the carbon-containing layer 120, and thereby to effectively reduce the bottom (B) CD of the hole 120h relative to a dimension of an upper portion of the hole 120h. That is, as shown in FIG. 2C, when the carbon-etching mixture gas 160 containing an effective amount of the Si-containing gas is used as a plasma to etch the carbon-containing layer 120, it has been found that a Si-containing material dissociates from the Si-containing gas, for example, radicals and ions such as $Si_xF_y$ dissociate, for example from $SiF_4$, and is deposited on exposed surfaces of the capping layer pattern 130a to form a polymer residue layer 170 consisting of Si, F and O constituents such that the capping layer pattern 130a is subjected to passivation and the etch selectivity of the capping layer pattern 130a relative to the carbon-containing layer 120 is improved. While only Si atoms and O atoms of the polymer residue layer 170 are indicated in FIG. 2C for convenience of illustration, the present invention is not so limited. It will be understood that the components of polymer residue layer 170 will vary in accordance with the chemical composition of the Si-containing gas. Further, when etching the carbon-containing layer 120 to form the carbon-containing layer pattern 120a, which has the hole 120h, the radicals and ions of the Si-containing gas such as $Si_xF_y$ also form the polymer residue layer 170 consisting of Si, F and O constituents on the exposed sidewalls of the hole 120h, thus also forming a passivation layer on these sidewalls. The passivation layer serves as an etch mask until the etching process for forming the hole 120h ends, such that the CD at the bottom B of the hole 120h is smaller than the CD at the upper portion or inlet of the hole 120h. This result can be understood as follows: The etching process described above is a plasma etching process in which the carbon-containing layer 120 is anisotropically etched by ion bombardments. The polymer residue layer 170 serves as an etching mask in the anisotropic plasma etching process. Therefore, the ions which go straight into the hole 120h cannot reach a portion of the carbon-containing layer 120 that is covered by the polymer residue layer 170 and thereunder. Therefore, the CD at the bottom of the hole 120h is smaller than the CD of the upper portion or inlet of the hole 120h.

In the results of experiments conducted by the present inventors, the polymer residue layer 170, which is formed of radicals and ions such as $Si_xF_y$ dissociated from the Si-containing gas, was not substantially observed at the bottom B of the hole 120h (consistent with the way the hole 120h is illustrated in FIG. 2C). This is believed to be because the radicals and ions are well deposited on the sidewalls of the hole 120h such that the flux of the radicals and ions, such as $Si_xF_y$ at the bottom B of the hole 120h, is substantially less than that at the top, that is, the inlet, of the hole 120h.

In another exemplary embodiment of the present invention, the carbon-etching mixture gas 160 may include $O_2$, a Si-containing gas, and at least one gas selected from $N_2$ gas and an inert gas. In this case, the carbon-etching mixture gas 160 may include about 20 to 95% by volume of $O_2$ based on the total volume of the carbon-etching mixture gas 160, about 50 to 5% by volume of a Si-containing gas based on the total volume of the carbon-etching mixture gas 160, about 0 to 100% by volume of $N_2$ relative to the volume of $O_2$ in the carbon-etching mixture gas 160, and about 0 to 50% by volume of an inert gas relative to the volume of $O_2$ in the carbon-etching mixture gas 160. In this invention embodiment, the content of $N_2$ and the content of the inert gas in the carbon-etching mixture gas 160 are not both zero. The presence of $N_2$ gas in the mixture gas provides a lower etch rate than would undiluted $O_2$ with respect to the carbon-containing layer 120, but the $N_2$ gas serves to increase passivation of the sidewalls of the carbon-containing layer pattern 120a in the hole 120h during the etching of the carbon-containing layer 120. This improves anisotropic etching properties and reduces the bottom CD of the hole 120h. The presence of inert gas in the carbon-etching mixture gas improves anisotropic dry etching properties of the carbon-etching mixture gas and also stabilizes a plasma atmosphere. The inert gas may be selected from the group consisting of Ar, He, Xe and Kr.

In another exemplary embodiment of the present invention, the carbon-etching mixture gas 160 may further include a $C_xF_y$ series gas, such as $CF_4$, $C_2F_6$, $C_3F_8$, $C_4F_8$, $C_4F_6$, $C_5F_8$ or the like. The $C_xF_y$ series gas may be added to the carbon-etching mixture gas to increase an etch rate of the carbon-containing layer 120, if that is necessary. In this invention embodiment, the carbon-etching mixture gas 160 may include for example about 0 to 10% by volume of the $C_xF_y$ series gas based on the total volume of the carbon-etching mixture gas 160.

To optimally establish anisotropic etching conditions for obtaining an excellent sidewall profile in the hole 120h defined by the carbon-containing layer pattern 120, RF bias power at the side of the semiconductor substrate 100 may be properly controlled with appropriate etching equipment.

Figure 2D:
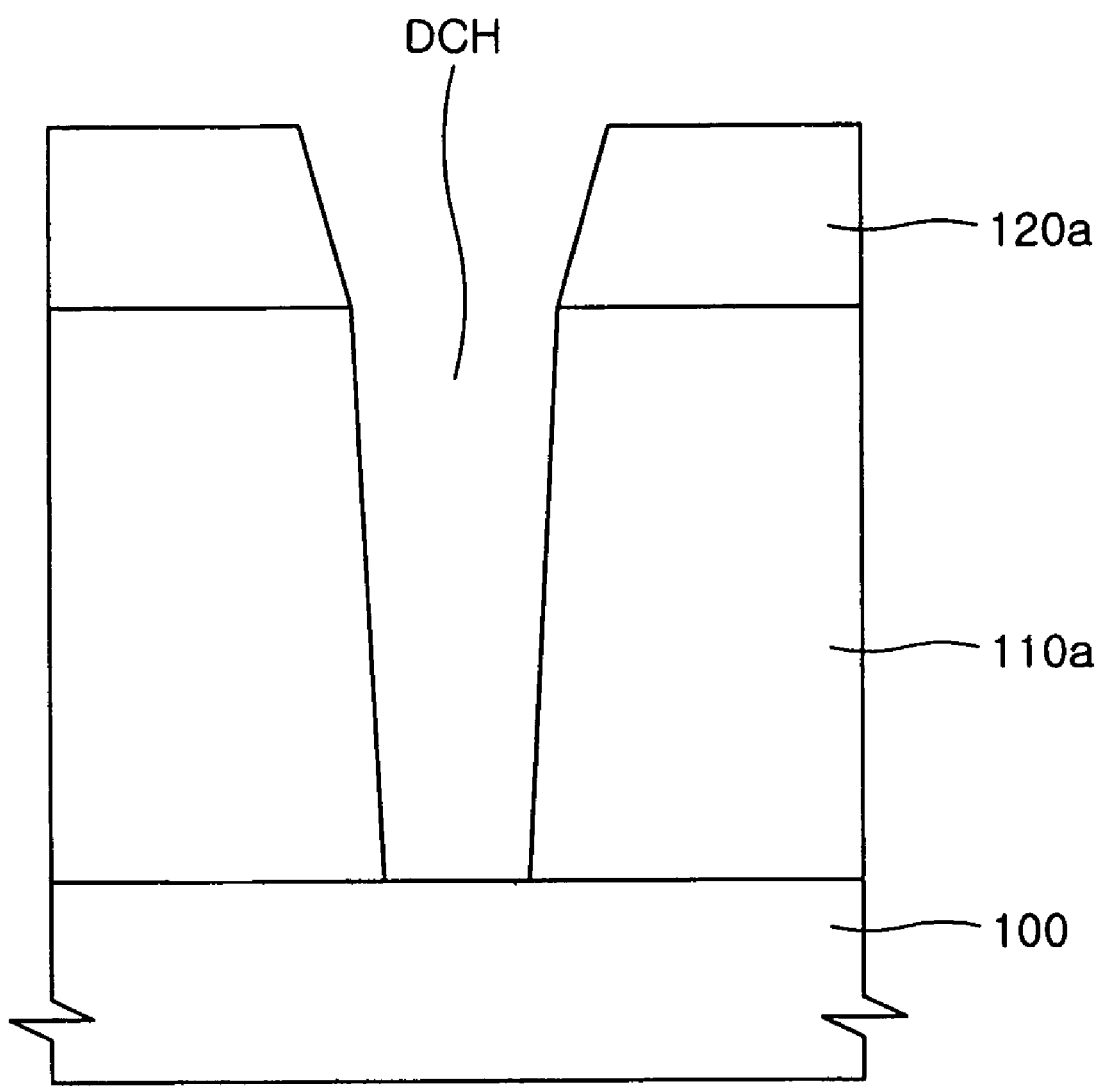

Referring to FIG. 2D, after completion of the etching step depicted in FIG. 2C (as as described above), the polymer residue layer 170 is removed. For example, an etching process using a second mixture gas containing $CF_4$ and Ar, or a second mixture gas containing $Cl_2$ and Ar may be used to remove the polymer residue layer 170.

The interlayer insulating layer 110 is then anisotropically etched using the carbon-containing layer pattern 120a (formed by the etching process depicted in FIG. 2C) as a second etch mask to form an interlayer insulating layer pattern 110a defining a direct contact hole (DCH). In this process, the capping layer pattern 130a (formed by the etching process depicted in FIG. 2C) may be removed. Alternatively, the capping layer pattern 130a may be removed through a separate process before or after the etching process for forming the direct contact hole (DCH).

While the use of the carbon-containing layer pattern 120a and the capping layer pattern 130a for forming the direct contact hole (DCH) in the interlayer insulating layer 110 has been illustrated in the above described embodiment, the present invention is not limited to such use. That is, it will be appreciated by those skilled in the art that the present invention may be equally applied to semiconductor fabrication in which the carbon-containing layer pattern 120a is used as an etch mask to etch other material layers for a semiconductor device, for example for etching various material layers such as a polysilicon layer, an insulating layer, a conductive layer or the like, instead of or in addition to etching the interlayer insulating layer.

In a method according to a further embodiment of the present invention, when etching the carbon-containing layer using the capping layer pattern as the first etch mask (as depicted in FIG. 2C), the following sample was prepared for an experiment in which the etching properties of the carbon-containing layer were evaluated by adjusting the composition of a carbon-etching gas. First, an ACL was formed to a thickness of about 1500 Å on an interlayer insulating layer formed on a semiconductor substrate, and a capping layer composed of SiON was formed to a thickness of about 260 Å on the ACL. An organic anti-reflection layer and a photoresist layer were then sequentially formed to thicknesses of about 380 Å and 1600 Å on the capping layer, respectively. The photoresist layer was patterned using a typical method to form a photoresist pattern, and the pattern was transferred to the capping layer to form the capping layer pattern. The ACL was etched in dual plasma CCP-based plasma etching equipment using the capping layer pattern as an etch mask. For this etching step, the process temperature (substrate-side temperature) was about 30 Å, and process pressure was about 15 mT. A carbon-etching mixture gas containing $O_2$, $SiF_4$, $N_2$ and Ar was used as a carbon-etching gas. In this example, $O_2$, $SiF_4$, $N_2$ and Ar were flowed at the rates of 40 sccm, 20 sccm, 20 sccm and 20 sccm, respectively, resulting in a carbon-etching mixture gas having a volume concentration of 40% $O_2$, 20% $SiF_4$, 20% $N_2$, and 20% Ar. The etching time of the ACL was about 90 seconds.

Figure 3A:
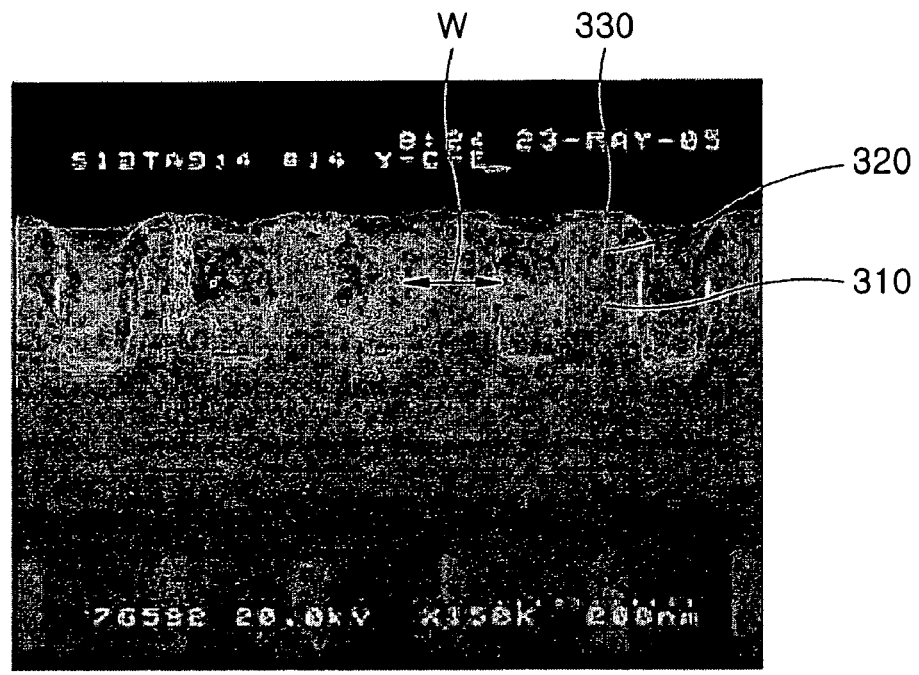
FIGS. 3A and 3B are respectively a sectional SEM image and a plan SEM image illustrating the results of etching a carbon-containing layer using a capping layer pattern as a first etch mask in a method of fabricating a semiconductor device according to one embodiment of the present invention.
Figure 3B:
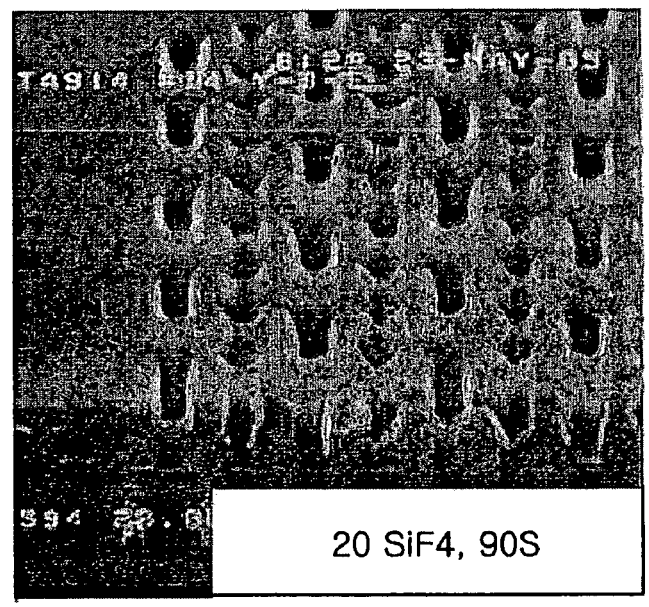

FIGS. 3A and 3B are respectively a sectional SEM image and a plan SEM image illustrating the results of etching a carbon-containing layer using a capping layer pattern as a first etch mask according to the above-described method.

In FIGS. 3A and 3B, an ACL pattern 310, a capping layer pattern 320 remaining on the ACL pattern 310, and a polymer residue layer 330, which comprises a Si series polymer, can be seen. In FIG. 3A, the ACL pattern 310 had a width of about 80 nm.

Figure 4A:
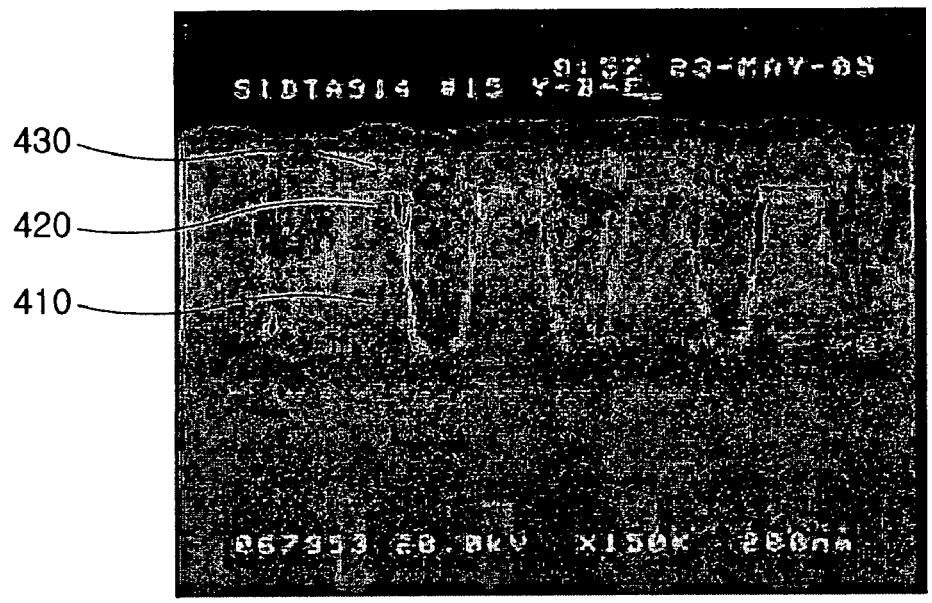
FIGS. 4A and 4B are respectively a sectional SEM image and a plan SEM image illustrating the results of etching a carbon-containing layer using a capping layer pattern as a first etch mask in a method of fabricating a semiconductor device according to another embodiment of the present invention.
Figure 4B:
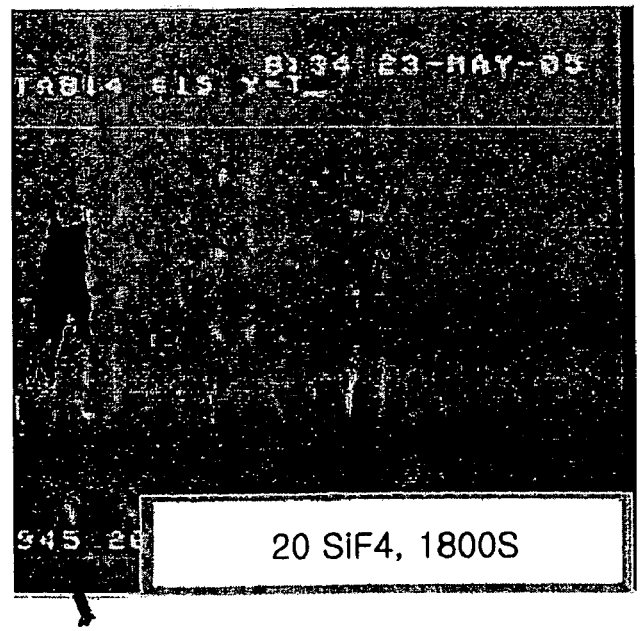

FIGS. 4A and 4B are respectively a sectional SEM image and a plan SEM image illustrating the results of etching a carbon-containing layer using a capping layer pattern as a first etch mask under the conditions used in the above-described method, except that in this example the etching time for the ACL was 1800 seconds (i.e., about 20 times longer than the etching time used for the FIGS. 3A and 3B example).

In FIGS. 4A and 4B, an ACL pattern 410, a capping layer pattern 420 remaining on the ACL pattern 310, and a polymer residue layer 430, which comprises a Si series polymer, can be seen, similar to that seen in FIGS. 3A and 3B. The sidewall profile of the ACL pattern 410 is seen to have a greater gradient than the sidewall profile of the ACL pattern 310 such that the bottom CD of each hole in the ACL pattern 410 is smaller than the hole in the ACL pattern 310. In addition, it can be seen that the polymer residue layer 430 remaining on the capping layer pattern 420 has a greater thickness than the polymer residue layer 330 remaining on the capping layer pattern 320. It can be appreciated from these results that adjustment of the etching time for the ACL can be used along with other process parameters to control a passivation effect by polymer, such that an ACL pattern defining the hole having a desired sidewall gradient and bottom CD is formed. The sidewall gradient and the bottom CD can also be controlled in part by adjusting the flow rate of a Si-containing carbon-etching mixture gas as well as by adjusting the etching time.

Figure 5A:
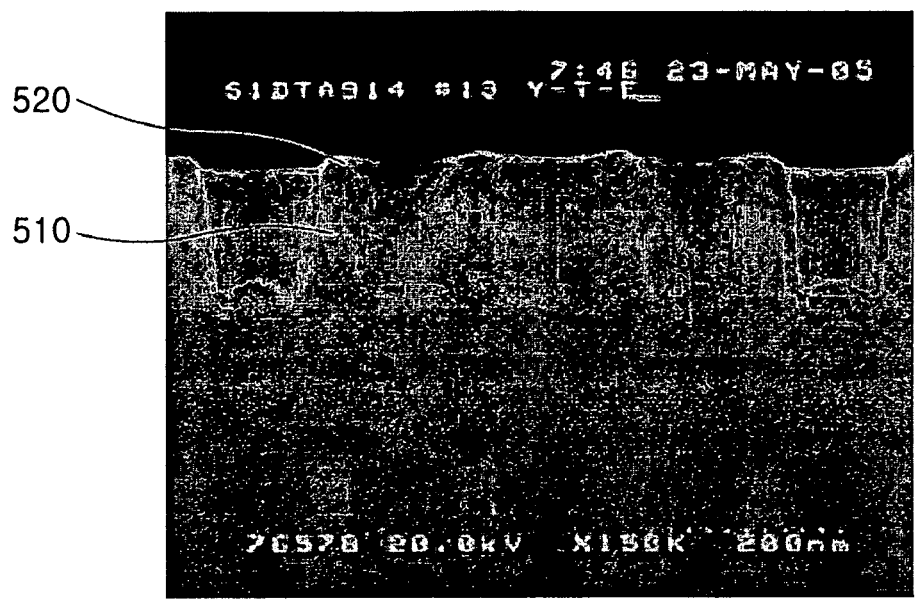
FIGS. 5A and 5B are respectively a sectional SEM image and a plan SEM image illustrating the results of etching a carbon-containing layer using a capping layer pattern as an etch mask in accordance with a prior art technique.
Figure 5B:
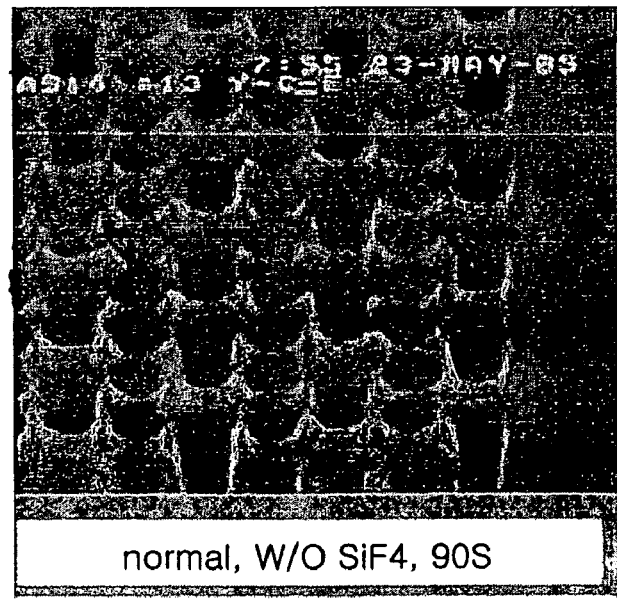

FIGS. 5A and 5B are respectively a sectional SEM image and a plan SEM image illustrating the results of an experimental example not performed in accordance with the methods of this invention conducted for purposes of comparison with methods according to embodiments of the present invention.

As shown in FIGS. 5A and 5B, only small/thin portions of the capping layer pattern 520 remain on the ACL pattern 510. Those remaining portions of the capping layer pattern 520 do not sufficiently perform the function of an etch mask for etching the ACL. As a result, neighboring holes are not distinctly separated from one another but rather are partially connected to or overlap with each other, as shown in FIG. 5B.

In other words, when the ACL is etched using a carbon-etching mixture gas that does not contain $SiF_4$ or a similar silicon material as a component of the etching gas, as in the example shown in FIGS. 5A and 5B, a large amount of erosion of the SiON layer used as the capping layer occurs. However, when a $SiF_4$-containing carbon-etching gas is used to etch the ACL, as in the examples shown in FIGS. 3A and 3B and FIGS. 4A and 4B, the etch rate of the capping layer pattern is dramatically reduced and erosion of the SiON layer used as the capping layer is suppressed by the passivation effect of $SiF_x$ or similar silicon material. Further, as in the example shown in FIGS. 4A and 4B, when the $SiF_4$-containing etching gas is used to etch the ACL, the SiON layer is not adversely affected even when the etching time increases; and, rather, the sidewalls of the SiON layer and the ACL pattern are subjected to passivation by the formation of a polymer residue layer, comprising such as $Si_xF_yO_z$, thereby preventing or reducing the erosion of the SiON capping layer and thereby also reducing the bottom CD of the hole defined by the ACL pattern.

In an etching process for forming a fine pattern for a high-integration semiconductor device in accordance with the present invention, a plasma of a carbon-etching mixture gas formed of $O_2$ and a Si-containing gas is used to anisotropically etch a carbon-containing layer which is to be used as etch mask. By etching the carbon-containing layer in this manner, a Si series polymer residue layer, which is an etching residue, may be formed on the capping layer pattern used as the first etch mask for the step of etching the carbon-containing layer. This polymer residue layer protects the capping layer pattern, thereby obtaining improved etch selectivity of the capping layer pattern relative to the carbon containing layer. Further, the Si series polymer residue layer is also deposited on at least the upper portions of the sidewalls of the carbon-containing layer pattern while the carbon-containing layer is being etched. The polymer residue layer that is deposited on the carbon-containing layer sidewalls also acts as an etch mask during the etching processes, thereby reducing a bottom CD of the resulting hole.

Accordingly, the present invention is particularly advantageously applicable to the formation of a semiconductor contact hole having a relatively large aspect ratio as needed to form a contact for a highly integrated semiconductor device. Neighboring contact holes maintain a discrete distance from each other upon etching, thereby preventing a short-circuit between neighboring contacts, even when an interval between neighboring contact holes is as narrow as a few tens or less. It is also possible to reliably form a contact hole with a desired cone-like shape by etching the carbon-containing layer using a first etch mask having sufficient etch resistance, and then by etching an etched film using the thus obtained carbon-containing layer pattern as a second etch mask.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of etching a carbon-containing layer on a semiconductor substrate to form a carbon-containing layer pattern, the method comprising the sequential steps of:
   forming a mask pattern on the carbon-containing layer to partially expose a top surface of the carbon-containing layer; and
   anisotropically etching the portion of the carbon-containing layer exposed by the mask pattern using a plasma comprising a carbon-etching mixture gas formed of $O_2$ and a Si-containing gas, the mask pattern serving as an etch mask to form the carbon-containing layer pattern.

2. The method of claim 1, wherein the Si-containing gas is selected from the group consisting of $SiF_4$, $SiCl_4$, $SiH_4$, $SiCl_xF_y$ (wherein x+y=4) and combinations thereof.

3. The method of claim 1, wherein the carbon-etching mixture gas consists essentially of about 50 to 95% by volume of $O_2$ and about 50 to 5% by volume of the Si-containing gas based on the total volume of the carbon-etching mixture gas.

4. The method of claim 1, wherein the carbon-etching mixture gas further includes at least one material selected from $N_2$ and an inert gas.

5. The method of claim 4, where the inert gas is selected from the group consisting of Ar, He, Xe and Kr.

6. The method of claim 1, wherein the carbon-etching mixture gas consists essentially of about 20 to 95% by volume of $O_2$ based on the total volume of the carbon-etching mixture gas, about 50 to 5% by volume of the Si-containing gas based on the total volume of the carbon-etching mixture gas, about 0 to 100% by volume of $N_2$ relative to the volume of $O_2$ in the carbon-etching mixture gas, and about 0 to 50% by volume of an inert gas relative to the volume of $O_2$ in the carbon-etching mixture gas, and further wherein the content of $N_2$ and the content of the inert gas in the carbon-etching mixture gas are not simultaneously zero.

7. The method of claim 1, wherein the carbon-etching mixture gas further includes a $C_xF_y$ series gas.

8. The method of claim 7, wherein the carbon-etching mixture gas contains less than 10% by volume of the $C_xF_y$ series gas based on the total volume of the carbon-etching mixture gas.

9. The method of claim 1, wherein the carbon-containing layer is formed of a material selected from the group consisting of ACL (amorphous carbon layer), SiLK, NCP and AHM.

10. The method of claim 1, further comprising the step of removing a polymer residue on the carbon-containing layer pattern and the mask pattern by means of a plasma etching process using a gas including $CF_4$, $Cl_2$, or a combination thereof after completion of the step of forming the carbon-containing layer pattern.

11. The method of claim 1, wherein the mask pattern is formed of silicon oxide, silicon oxynitride, Si, SiGe, or combinations thereof.

12. A method of fabricating a semiconductor device, the method comprising the sequential steps of:
   forming an interlayer insulating layer on a semiconductor substrate;
   forming a carbon-containing layer on the interlayer insulating layer;
   forming a capping layer on the carbon-containing layer;
   patterning the capping layer using a photolithography process to form a capping layer pattern partially exposing a top surface of the carbon-containing layer;
   anisotropically etching the carbon-containing layer with a plasma comprising a carbon-etching mixture gas formed of $O_2$ and a Si-containing gas using the capping layer pattern as a first etch mask to form a carbon-containing layer pattern; and anisotropically etching the interlayer insulating layer using the carbon- containing layer pattern as a second etch mask to form a contact hole through the interlayer insulating layer.

13. The method of claim 12, wherein the Si-containing gas is selected from the group consisting of $SiF_4$, $SiCl_4$, $SiH_4$, $SiCl_xF_y$ (wherein x+y=4) or combinations thereof.

14. The method of claim 12, wherein the carbon-etching mixture gas consists essentially of about 50 to 95% by volume of $O_2$ and about 50 to 5% by volume of the Si-containing gas based on the total volume of the carbon-etching mixture gas.

15. The method of claim 12, wherein the carbon-etching mixture gas further includes at least one material selected from $N_2$ and an inert gas.

16. The method of claim 15, where the inert gas is selected from the group consisting of Ar, He, Xe and Kr.

17. The method of claim 12, wherein the carbon-etching mixture gas consists essentially of about 20 to 95% by volume of $O_2$ based on the total volume of the carbon-etching mixture gas, about 50 to 5% by volume of the Si-containing gas based on the total volume of the carbon-etching mixture gas, about 0 to 100% by volume of $N_2$ relative to the volume of $O_2$ in the carbon-etching mixture gas, and about 0 to 50% by volume of an inert gas relative to the total volume of $O_2$ in the carbon-etching mixture gas, and further wherein the content of $N_2$ and the content of the inert gas in the carbon-etching mixture gas are not simultaneously zero.

18. The method of claim 12, wherein the carbon-etching mixture gas further includes a $C_xF_y$ series gas.

19. The method of claim 18, wherein the carbon-etching mixture gas contains less than 10% by volume of the $C_xF_y$ series gas based on the total volume of the carbon-etching mixture gas.

20. The method of claim 12, wherein the carbon-containing layer is formed of a material selected from the group consisting of ACL (amorphous carbon layer), SiLK, NCP and AHM.

21. The method of claim 12, further comprising the step of removing a polymer residue on the carbon-containing layer pattern and the mask pattern by means of a plasma etching process using a gas composed of $CF_4$, $Cl_2$, or a combination thereof after completion of the step of forming the carbon-containing layer pattern.

22. The method of claim 12, wherein the capping layer is formed of silicon oxide, silicon oxynitride, Si, SiGe, or combinations thereof.

23. The method of claim 12, wherein the capping layer is formed of SiON, PB (plasma-enhanced) oxide, TEOS (tetraethyl orthosilicate), ALD (atomic layer deposition) oxide, Si, SiGe, or combinations thereof.

* * * * *

UNITED STATES PATENT AND TRADEMARK OFFICE
CERTIFICATE OF CORRECTION

PATENT NO. : 7,494,934 B2  Page 1 of 1
APPLICATION NO. : 11/512026
DATED : February 24, 2009
INVENTOR(S) : Keun-hee Bai It is certified that error appears in the above-identified patent and that said Letters Patent is hereby corrected as shown below:

Column 12, line 24 delete "PB" and insert --PE--

Signed and Sealed this

Nineteenth Day of May, 2009

JOHN DOLL
*Acting Director of the United States Patent and Trademark Office*